(12) United States Patent
Huang et al.

(10) Patent No.: US 7,436,009 B2
(45) Date of Patent: Oct. 14, 2008

(54) VIA STRUCTURES AND TRENCH STRUCTURES AND DUAL DAMASCENE STRUCTURES

(75) Inventors: Yi-Chen Huang, Hsinchu (TW); Chien-Chung Fu, Sanchong (TW); Ming-Hong Hsieh, Bade (TW); Hui Ouyang, Hsinchu (TW); Yi-Nien Su, Kaohsiung (TW); Hun-Jan Tao, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/732,883

(22) Filed: Apr. 4, 2007

(65) Prior Publication Data

US 2007/0184669 A1      Aug. 9, 2007

Related U.S. Application Data

(62) Division of application No. 11/039,043, filed on Jan. 18, 2005, now Pat. No. 7,217,663.

(51) Int. Cl.
    *H01L 29/06* (2006.01)
(52) U.S. Cl. ............ 257/244; 257/622; 257/635; 257/E21.577; 257/E21.585

(58) Field of Classification Search ............ 257/204, 257/244, 622, 635, E21.575, E21.577, E21.585
See application file for complete search history.

(56) References Cited

U.S. PATENT DOCUMENTS

| | | | |
|---|---|---|---|
| 2001/0002333 A1 | 5/2001 | Huang et al. | |
| 2003/0077897 A1* | 4/2003 | Tsai et al. | 438/633 |
| 2003/0207564 A1 | 11/2003 | Ahn et al. | |
| 2004/0175921 A1 | 9/2004 | Cowley et al. | |
| 2004/0224497 A1 | 11/2004 | Barth | |
| 2005/0124164 A1 | 6/2005 | Sakata et al. | |
| 2005/0153505 A1 | 7/2005 | Gambino et al. | |
| 2005/0167780 A1 | 8/2005 | Edelstein et al. | |

* cited by examiner

*Primary Examiner*—George Fourson
*Assistant Examiner*—Joannie A Garcia
(74) *Attorney, Agent, or Firm*—Duane Morris LLP

(57) ABSTRACT

Via hole and trench structures and fabrication methods are disclosed. The structure includes a conductive layer in a dielectric layer, and a via structure in the dielectric layer contacting a portion of a surface of the conductive layer. The via structure includes the conductive liner contacting the portion of the surface of the first conductive layer. A trench structure is formed on the via structure in the dielectric without the conductive liner layer in the trench.

8 Claims, 16 Drawing Sheets

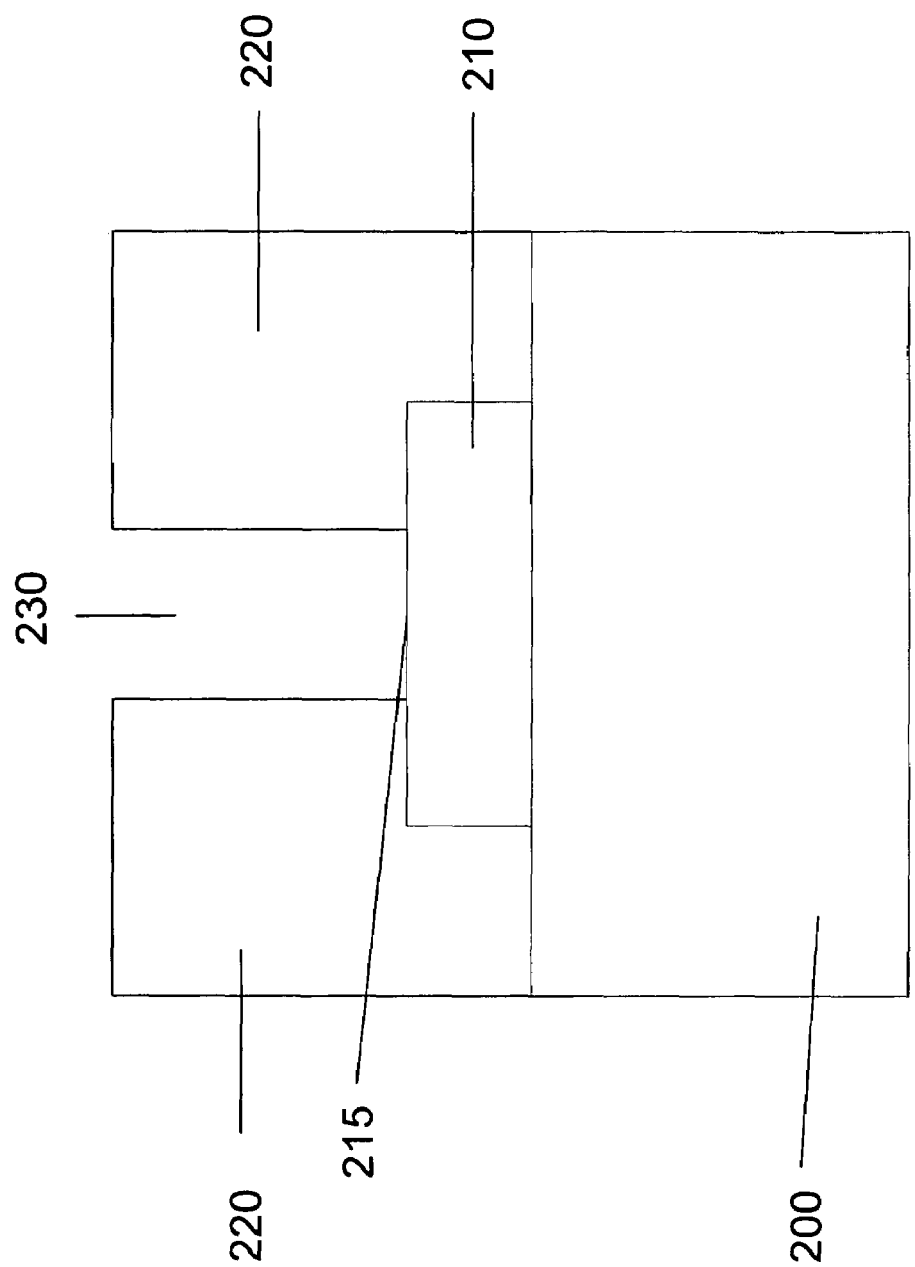

VIA STRUCTURES AND TRENCH STRUCTURES AND DUAL DAMASCENE STRUCTURES

RELATED APPLICATION

This application is a divisional application of U.S. patent application Ser. No. 11/039,043, filed on Jan. 18, 2005, now U.S. Pat. No. 7,217,663 the contents of which are hereby incorporated by reference as if set forth in their entirety.

BACKGROUND OF THE INVENTION

1. Field of the Invention

The present invention relates to the fabrication of integrated circuit devices on semiconductor substrates and, more particularly relates to via hole and trench structures and fabrication methods thereof and dual damascene structures and fabrication methods thereof.

2. Description of the Related Art

The Complementary Metal Oxide Semiconductor (CMOS) technology has been recognized as the leading technology for use in digital electronics in general and for use in many computer products in particular. The miniaturization of CMOS technology according to a scaling rule is used in a semiconductor device to achieve large-scale integration and high-speed operation. In order to miniaturize CMOS devices, dual damascene technology has been applied to enhance integrity and speed of CMOS devices.

Generally, dual damascene technology includes: a via-first dual damascene process or a trench-first dual damascene process. For the via-first process, a via hole is first formed in a dielectric layer and on an etch stop layer covering a metal layer, and then a process for forming a trench is applied so as to form a via hole and trench structure. A conductive layer then is filled into the via hole and trench structure. A dual damascene structure is thus finished. In contrast, the trench-first process forms a trench in a dielectric layer, and then a process for defining a via hole is applied. No matter what process is applied, for connecting the metal layer with the conductive layer, the etch stop layer is penetrated.

FIGS. 1A and 1B are schematic cross sectional drawings showing a prior art method for removing a portion of an etch stop layer.

Referring to FIG. 1A, a metal layer 110 is in a substrate 100; an etch stop layer 120 covers the metal layer 110. A dielectric layer 130 is formed on the etch stop layer 120. A via hole and trench structure 140 is formed in the dielectric layer 130. As described above, the via hole and trench structure 140 can be formed by either a via-first process or a trench-first process. After the via hole and trench structure 140 is formed, the etch stop layer 120 still covers the metal layer 110. Before the formation of a conductive layer in the via hole and trench structure 140, an etch process 150 is applied to remove the etch stop layer 120 which is not covered by the dielectric layer 130.

Referring to FIG. 1B, an exposed top surface 110a of the metal layer 110 is formed in the via hole and trench structure 140. A problem occurs while the etch stop layer 120 which is not covered by the dielectric layer 130 is being removed. For the formation of the dual damascene structure, low-dielectric-constant materials have been adopted as the dielectric layer 130 for reducing intra-layer or inter-layer parasitic capacitances. Though having the advantage of low dielectric constants, these materials are vulnerable to the etch process 150 that includes a plasma treatment. After the plasma treatment, the physical structure and the inherent properties of the dielectric layer 130 are changed. Due to the change of the physical structure and the inherent properties, reliability of the dual damascene structure deteriorates. As a result, devices with such a dual damascene structure cannot perform normally.

U.S. Patent Publication No. 2001/00023333 (Huang) shows a method of fabricating a dual damascene structure. In this application, a barrier layer serves as an activation center for selective deposition during the selective deposition of the conductive layer. In contrast, a diffusion barrier layer does not serve as an active center. Accordingly, a high selectivity between the barrier layer and the diffusion barrier layer can be obtained.

U.S. Patent Publication No. 2003/0207564 (Ahn) shows a copper damascene structure. The structure includes a Ti-silicon-nitride barrier layer formed by organic-metallic atomic layer deposition. Copper is selectively deposited by a chemical vapor deposition (CVD) process and/or by an electrodeless deposition technique.

None of these applications address the problem described above.

SUMMARY OF THE INVENTION

A structure comprises a dielectric layer, a conductive layer, a via structure, a conductive liner and a trench structure. The conductive layer is within the dielectric layer. The via structure is in the dielectric layer, contacting a portion of a surface of the conductive layer. The via structure comprises the conductive liner contacting the portion of the surface of the conductive layer. The trench structure is on the via structure without the conductive liner therein.

The above and other features of the present invention will be better understood from the following detailed description of the preferred embodiments of the invention that is provided in connection with the accompanying drawings.

BRIEF DESCRIPTION OF THE DRAWINGS

FIGS. 2A-2F are a series of schematic cross sectional diagrams illustrating an exemplary embodiment for forming a via hole and trench structure.

DETAILED DESCRIPTION

Figure 1A:
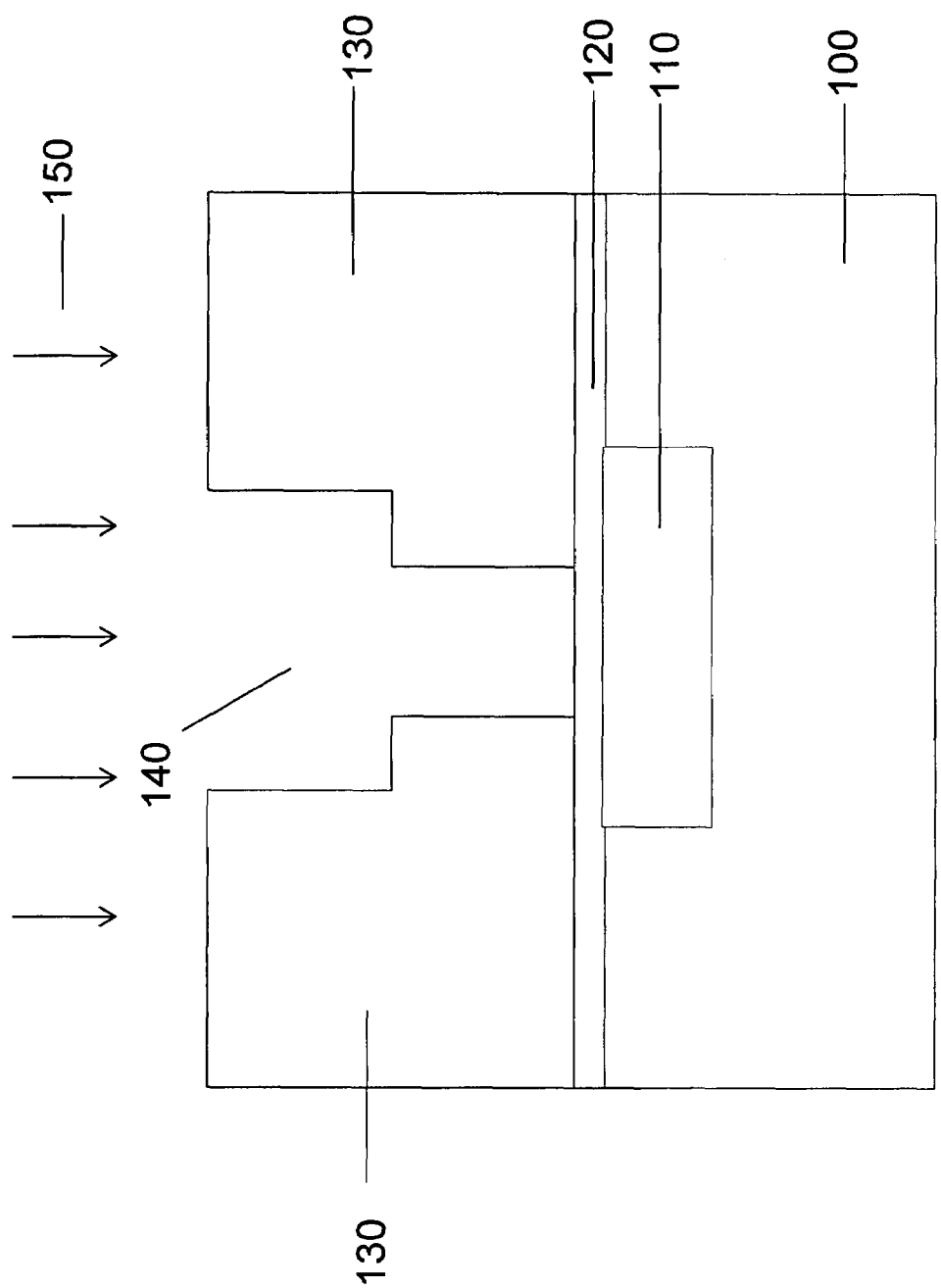
FIG. 1A and 1B are schematic cross sectional drawings showing a prior art method for breaking through an etch stop layer.
Figure 1B:
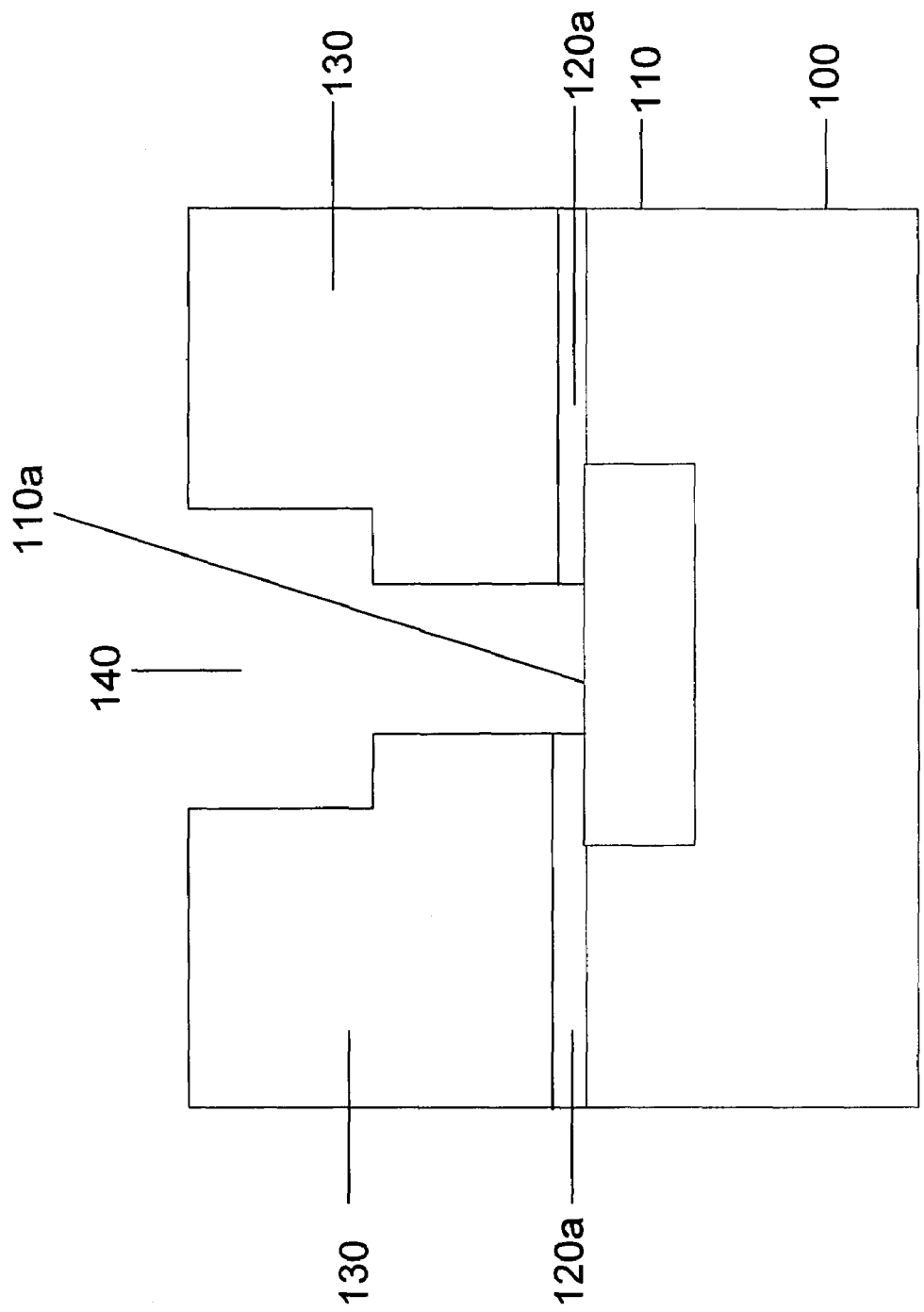

FIGS. 2A-2F are a series of schematic cross sectional diagrams illustrating an exemplary embodiment for forming a via hole and trench structure.

Referring to FIG. 2A, this embodiment first provides a semiconductor structure. The semiconductor structure comprises: a substrate 200, a conductive layer 210, a dielectric layer 220 and a via hole 230. The conductive layer 210 is in the dielectric layer 220 and over the substrate 200. The via hole 230 is in the dielectric layer 220, exposing a portion of a surface 215 of the conductive layer 210.

The substrate 200 can be, for example, a silicon substrate, a III-V compound substrate, or a glass substrate. The conductive layer 210 can be, for example, a metal layer, a polysilicon layer or the like. The metal layer can be, for example, aluminum, aluminum copper or copper. In some embodiments, the conductive layer 210 is copper. The conductive layer 210 can be formed by, for example, chemical vapor deposition (CVD), physical vapor deposition (PVD), electroplating or electroless plating or a combination thereof. The material of the dielectric layer 220 includes, for example, undoped silicate glass (USG), boron doped silicate glass (BSG), phosphorous doped silicate glass (PSG), boron phosphorous doped silicate glass (BPSG), polyimides, benzocyclobutene, parylenes, diamond-like carbon, poly(arylene ethers), cyclotenes, fluorocarbons, methyl silsesquioxane, hydrogen silsesquioxanes, nanoporous oxides or carbon doped silicon dioxides. The dielectric layer 220 can be formed by, for example, CVD, PVD, or spin coating.

The method of forming the structure shown in FIG. 2A comprises the following steps. First, the substrate 200 having the conductive layer 210 formed thereon is provided. A dielectric material (not shown) is then formed over the conductive layer 210 and the substrate 200. A photolithographic process and an etch process (not shown) are performed for forming the via hole 230 in the dielectric layer 220. The via hole 230 exposes the portion of the surface 215 of the conductive layer 210.

Figure 2B:
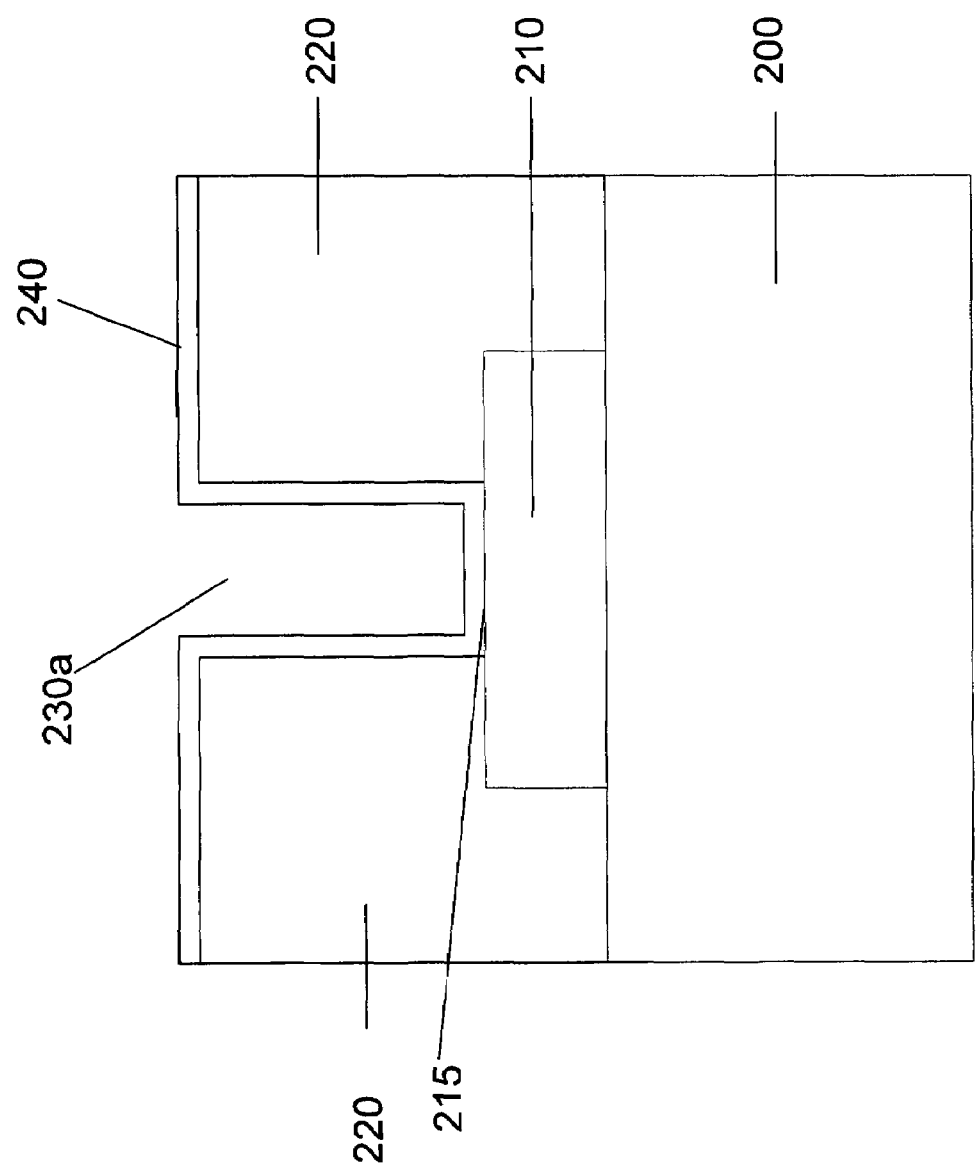

Referring to FIG. 2B, a substantially conformal conductive liner layer 240 is formed over the dielectric layer 220, the via hole 230 and the exposed surface 215 of the conductive layer 210. Accordingly, a via hole 230$a$ is formed in the dielectric layer 220.

The conductive liner layer 240 can be a metal film which is less reactive to oxygen than the conductive layer 210. The conductive liner layer 240 can be a film such as Ta, TaN, W, WN, Ti, TiN, or a combination film thereof. In some embodiments, the conductive liner layer 240 is TaN or TiN. The method of forming the conductive layer 210 may include CVD, PVD or a combination thereof. The conductive liner layer 240 is formed to be from about 10 angstroms to about 500 angstroms. The conductive liner layer 240 covers the exposed surface 215 of the conductive layer 210. Because of the covering, the oxidation occurring on the exposed surface 215 of the conductive layer 210 is avoided. Due to the low reactivity with oxygen for the conductive liner layer 240, oxidation occurring on the surface of the conductive liner is less serious. In some embodiments, the conductive liner layer 240 is not conformal over the structure in FIG. 2A. The conductive liner layer 240 may fill the via hole 230. The filling of the via hole 230, however, may increase the resistance of a dual damascene structure. But if the via hole 230 is not so high as to create a high-resistance via, the filling of the via hole 230 may still be feasible for a dual damascene structure. One of ordinary skill in the art, after viewing the description of this embodiment, will understand and can readily determine whether the conductive liner layer 240 should fill the via hole 230 in any given situation.

Figure 2C:
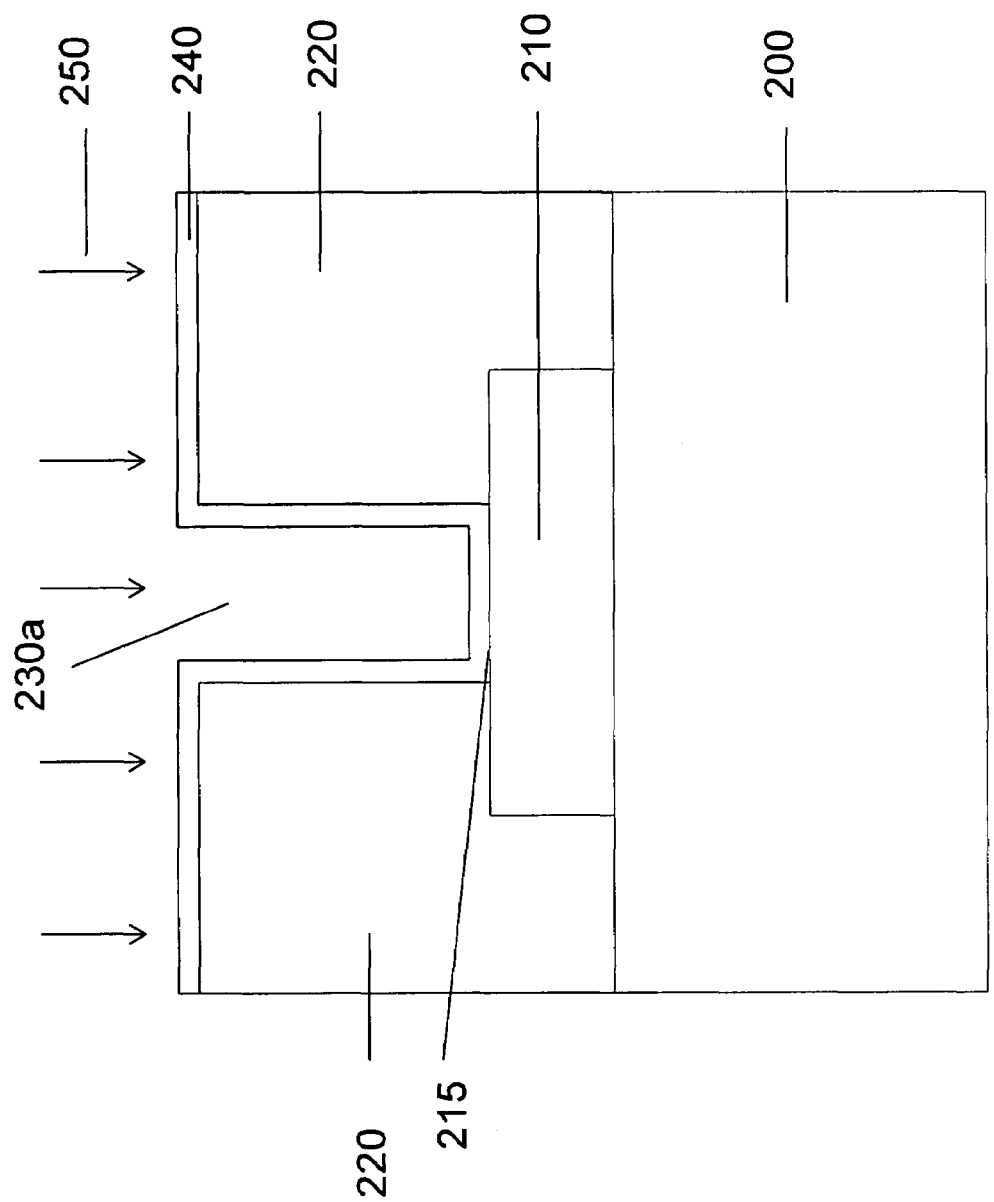

Referring to FIG. 2C, a plasma treatment 250 is performed on the surface of the conductive liner layer 240. The plasma treatment 250 can be, for example, a plasma process with a reaction gas that is hydrogen based, nitrogen based or a mixture thereof. The plasma treatment 250 removes at least one atomic layer of the oxide layers formed on the surface of the conductive liner layer 240. By removing the surface oxide layer of the conductive layer 250, the adhesion and conductivity of the via is thus improved. However, the plasma treatment 250 is not necessarily required. If the resistance of the conductive liner layer 240 is low enough so that the surface oxide layer of the conductive layer may not affect the conductivity of the dual damascene structure, the plasma treatment 250 is not required. After reading the description of this embodiment, one of ordinary skill in the art will understand whether to apply a plasma treatment on the surface of the conductive liner layer 240 in any given situation.

Figure 2D:
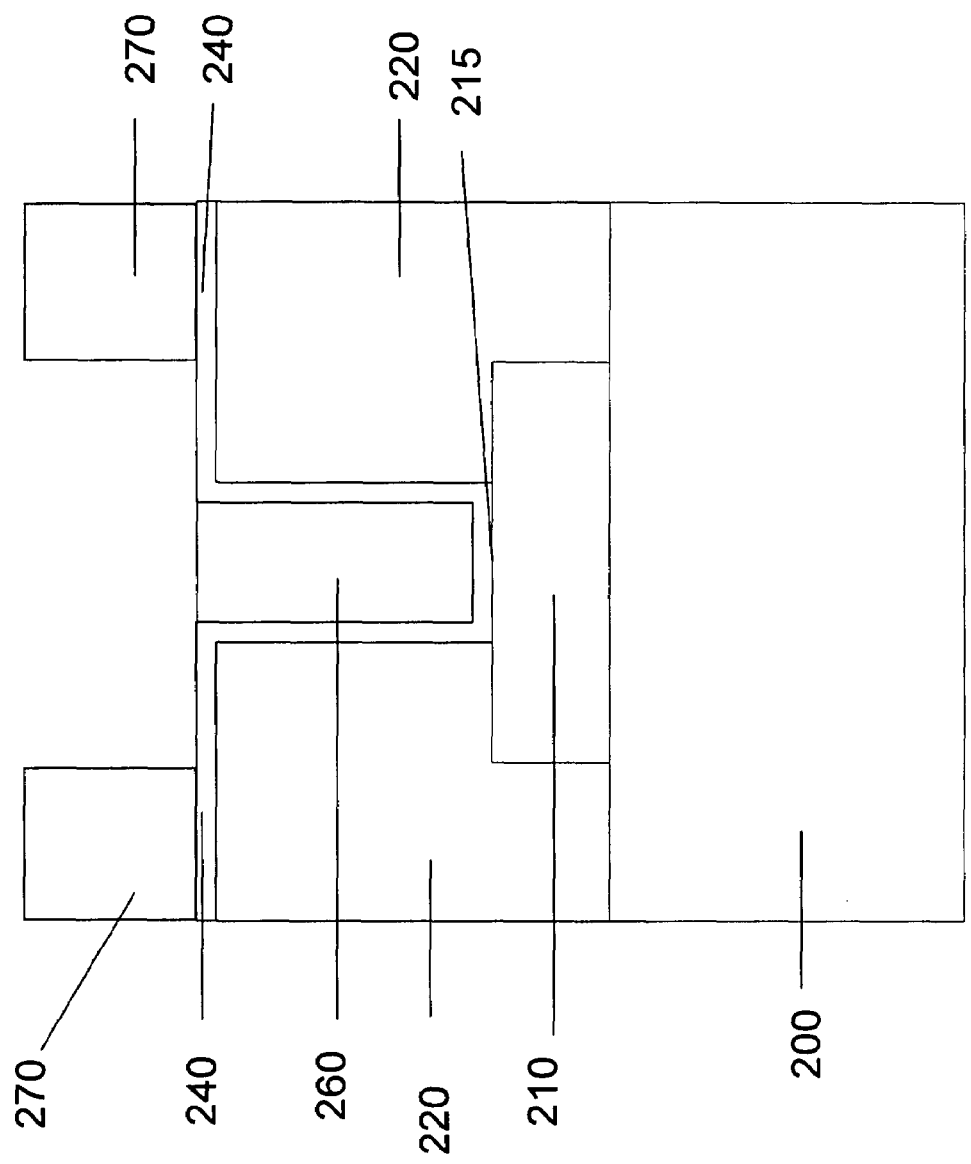

Referring to FIG. 2D, a planarization material 260 is formed in the via hole 230 and a patterned mask layer 270 is formed over the conductive liner layer 240.

The planarization material 260 can be a material such as polymer, polyimide or photoresist. The patterned mask layer 270 can be, for example, photoresist, dielectric material or any other material that is adapted to serve as an etch mask for a subsequent etch process. The plug of planarization material 260 can be formed first by forming a planarization layer (not shown) over the structure of FIG. 2C. The formation of the planarization layer includes, for example, CVD or spin-on coating. The portion of the planarization layer above the surface of the conductive liner layer 240 is then removed by, for example, chemical-mechanical polishing (CMP) or an etch-back process. The plug of planarization material 260 is thus formed in the via hole 230. In this embodiment, the patterned mask layer 270 is photoresist. The formation of the patterned mask layer 270 first forms a photoresist layer (not shown) over the structure after the planarization layer above the surface of the conductive liner layer 240 is removed. A photolithographic process is performed to pattern the photoresist layer. In some embodiments, the patterned mask layer 270 is a dielectric layer. A photoresist layer may be formed on the dielectric layer. A photolithographic process and an etch process form the patterned mask layer 270. Upon reading the disclosure of this embodiment, one of ordinary skill in the art will understand how to select the material of the patterned mask layer 270 and to perform the process in any given situation. In some embodiments, an anti-reflection coating layer (not shown) is formed between the conductive liner layer 240 and the patterned mask layer 270 to prevent interference or diffraction effects while performing the photolithographic process. The inclusion of the anti-reflection coating layer depends on the condition of the photolithographic process. One of ordinary skill in the art will understand that the formation of the anti-reflection coating layer depends on the conditions of the photographic process.

Figure 2E:
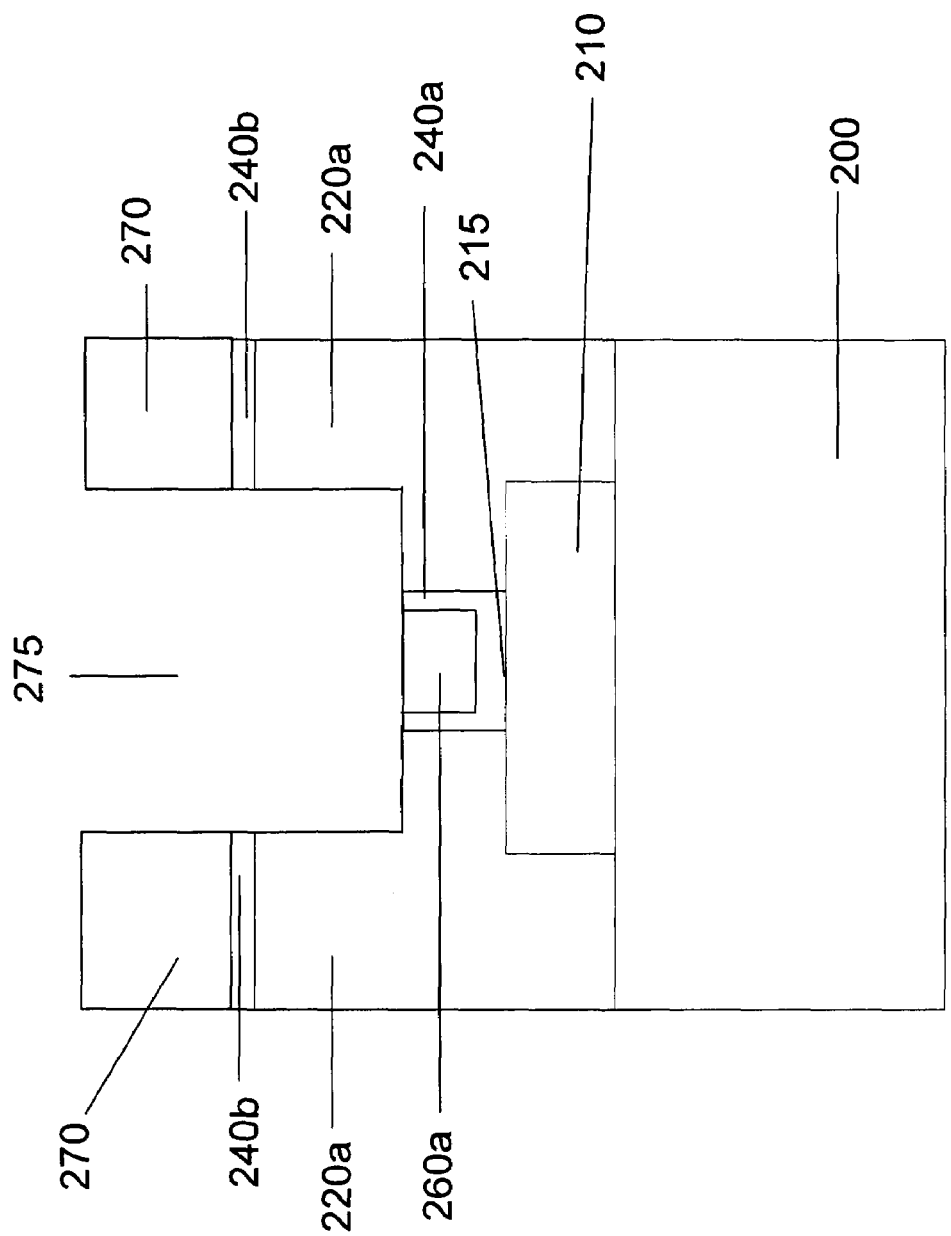

Referring to FIG. 2E, portions of the conductive liner layer 240, the dielectric layer 220 and the planarization material 260 are removed so as to form a trench 275 in the dielectric layer 220. By the removing process, the remaining conductive liners 240$a$ and 240$b$ are formed on the sidewalls of the via hole 230 and on the conductive layer 210, and on the dielectric layer 220, respectively. The removing process can be, for example, a $CF_4$ based or $C_4F_8$ based dry etch process. Though the planarization layer 260, the conductive liner layer 240 and the dielectric layer 220 are different materials, the removing process may remove these different materials without difficulty. One of ordinary skill in the art will understand that different etch processes may be applied to remove these different materials.

Figure 2F:
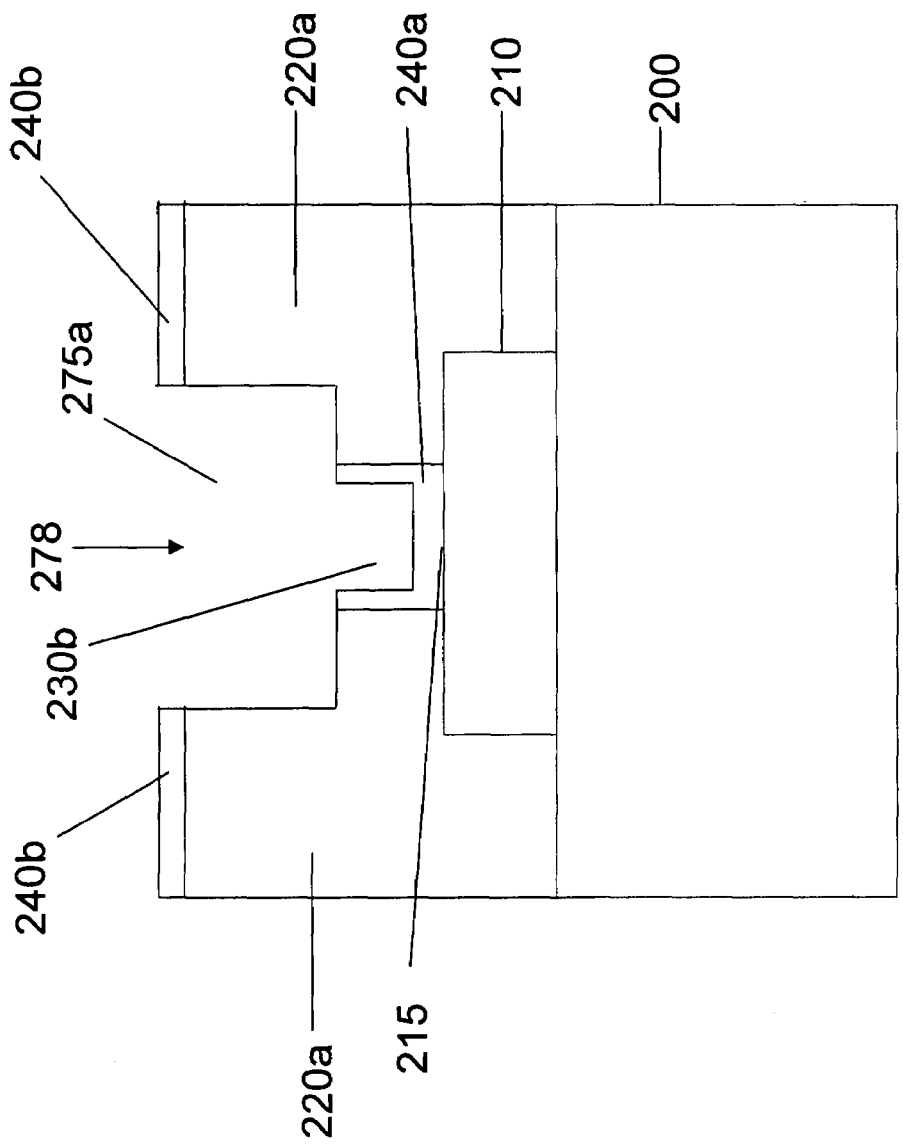

Referring to FIG. 2F, a mask layer removing process is applied to remove the patterned mask layer 270. The mask layer removing process can be, for example, a dry etch process or a wet etch process. As described above with reference to FIG. 2D, if the patterned mask layer 270 is photoresist, an oxygen base dry etch process can be used to removed the patterned mask layer 270. If the patterned mask layer 270 includes dielectric material, such as silicon nitride or silicon oxide, $CF_4$, $CHF_3$, $CH_2F_2$ or $NF_3$ etch gas can be provided to remove silicon nitride; a $CF_4$, $CHF_3$, $C_2F_6$, $C_3F_8$, or $C_4F_8$ etch gas can be applied to remove silicon oxide. Based on the teachings of this embodiment, one of ordinary skill in the art will understand how to select etch gases in response with a variety of different mask layer materials. In this embodiment, the via hole and trench structure 278 is formed. The conductive liner layer 240a covers the exposed surface 215 of the conductive layer 210. The trench 275a is on the via hole 230b without forming the conductive liner 240a therein.

Figure 2G:
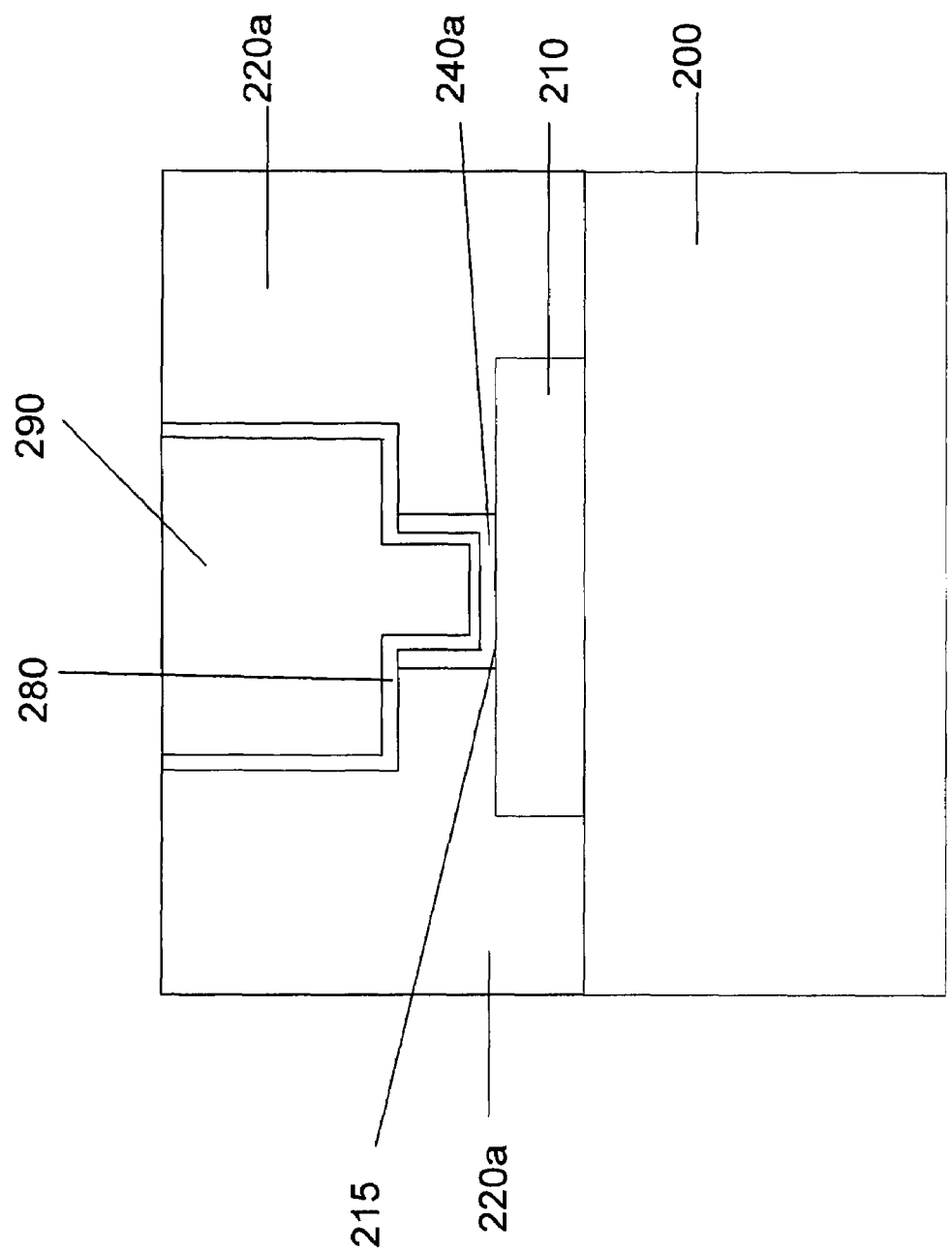
FIG. 2G is a schematic cross sectional drawing showing an exemplary dual damascene structure.

FIG. 2G is a schematic cross sectional drawing showing an exemplary dual damascene structure.

Referring to FIG. 2G, a barrier layer 280 is substantially conformal over the structure in FIG. 2F. A conductive layer 290 is then formed in the via hole and trench structure 278. The barrier layer 280 is formed before the formation of the conductive layer 290.

The barrier layer 280 can be a conductive layer such as Ta, TaN, W, WN, Ti, TiN, or a combination film thereof. The method of forming the barrier layer 280 includes CVD, PVD or a combination thereof. The conductive layer 290 can be, for example, aluminum, aluminum copper or copper and can be formed by, for example, CVD, PVD, electroplating or electroless plating or a combination thereof.

The structLire of FIG. 2G can be formed by first forming the barrier layer 280 over the structure of FIG. 2F. According to the structure with the barrier layer 280, a conductive material (not shown) is formed thereon. By CMP or an etch-back process, the conductive liners 240b, a portion of the barrier layer 280 and a portion of the conductive material are removed. A dual damascene structure is thus completed.

FIGS. 3A-3G are a series of schematic cross-sectional diagrams illustrating another exemplary embodiment for forming a via hole and trench structure.

Figure 3A:
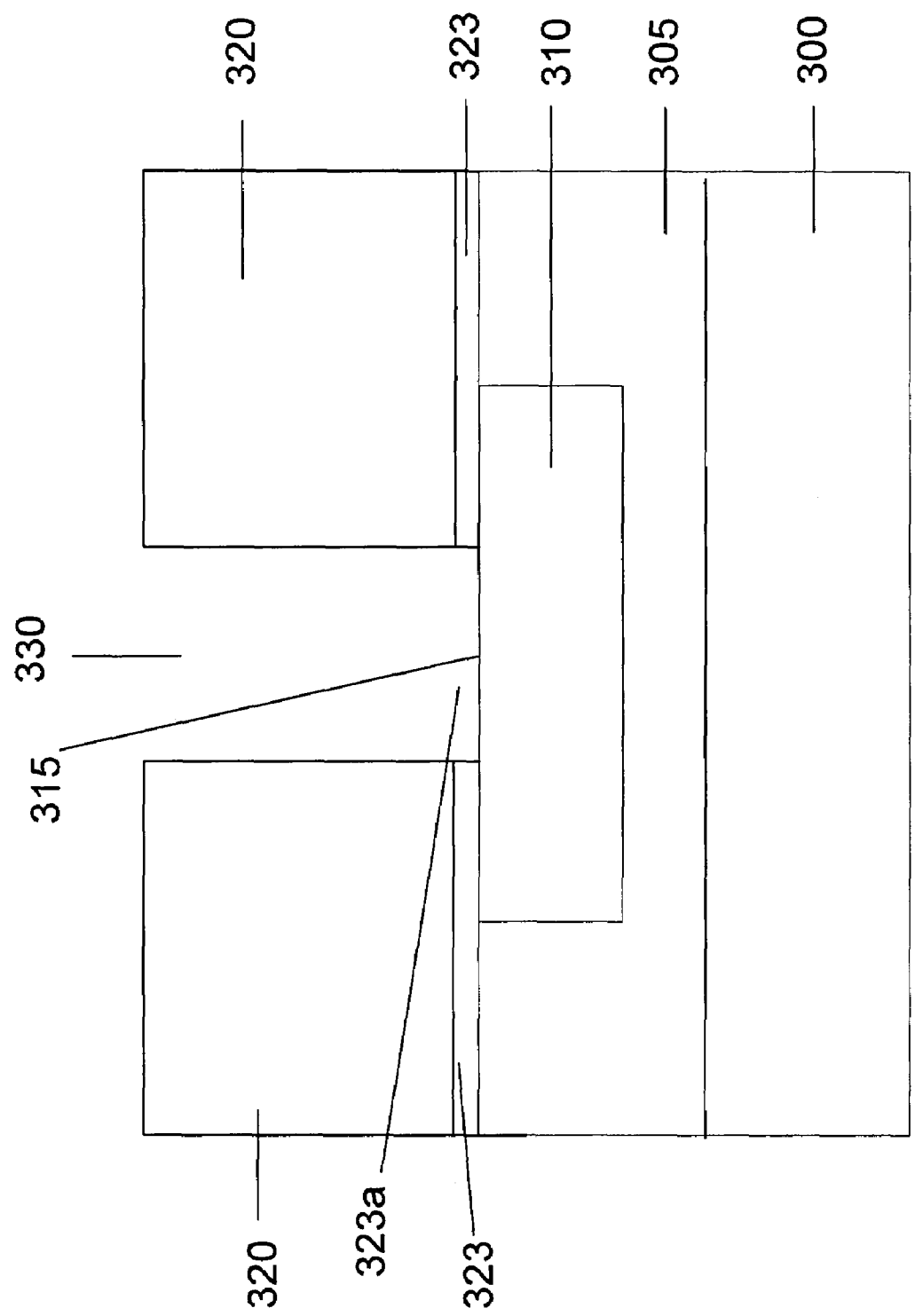
FIGS. 3A-3F are a series of schematic cross-sectional diagrams illustrating another exemplary embodiment for forming a via hole and trench structure.

Referring to FIG. 3A, this embodiment first provides a semiconductor structure. The semiconductor structure comprises: a substrate 300, a conductive layer 310, a first dielectric layer 305, a second dielectric layer 320, an etch stop layer 323 and a via hole 330. The conductive layer 310 is formed at a top surface in the first dielectric layer 305 and over the substrate 300. The second dielectric layer 320 is formed over the conductive layer 310. The via hole 330 is formed in the second dielectric layer 320 and the etch stop layer 323, exposing a portion of a surface 315 of the conductive layer 310. Accordingly, the etch stop layer 323 has an opening 323a corresponding to the exposed surface 315 of the conductive layer 310.

The substrate 300, the conductive layer 310, the second dielectric layer 320 and the via hole 330 can be the same as or equivalent to the substrate 200, the conductive layer 210, the dielectric layer 220 and the via hole 230 of FIG. 2A, respectively. Detailed descriptions of these elements are not repeated. The first dielectric layer 305 includes, for example, undoped silicate glass (USG), boron doped silicate glass (BSG), phosphorous doped silicate glass (PSG), boron phosphorous doped silicate glass (BPSG), polyimides, benzocyclobutene, parylenes, diamond-like carbon, poly(arylene ethers), cyclotenes, fluorocarbons, methyl silsesquioxane, hydrogen silsesquioxanes, nanoporous oxides or carbon doped silicon dioxides. The first dielectric layer 305 can be formed by, for example, CVD, PVD, or spin-on coating. The etch stop layer 323 can be a film, such as nitride or oxy-nitride with properties different from the second dielectric layer 320.

The method of forming the structure shown in FIG. 3A comprises following steps. First, the substrate 300 has the first dielectric layer 305 formed thereon and the conductive layer 310 in the first dielectric layer 305. The etch stop layer 323 is formed over the first dielectric layer 305. The second dielectric layer 320 is then formed over the etch stop layer 323. A photolithographic process and an etch process are performed for removing portions of the second dielectric layer 320 and the etch stop layer 323. By the removal of the portions of the second dielectric layer 320 and the etch stop layer 323, the via hole 330 is formed in the second dielectric layer 320 and the etch stop layer 323. The via hole 330 exposes the portion 315 of the surface of the conductive layer 310.

Figure 3B:
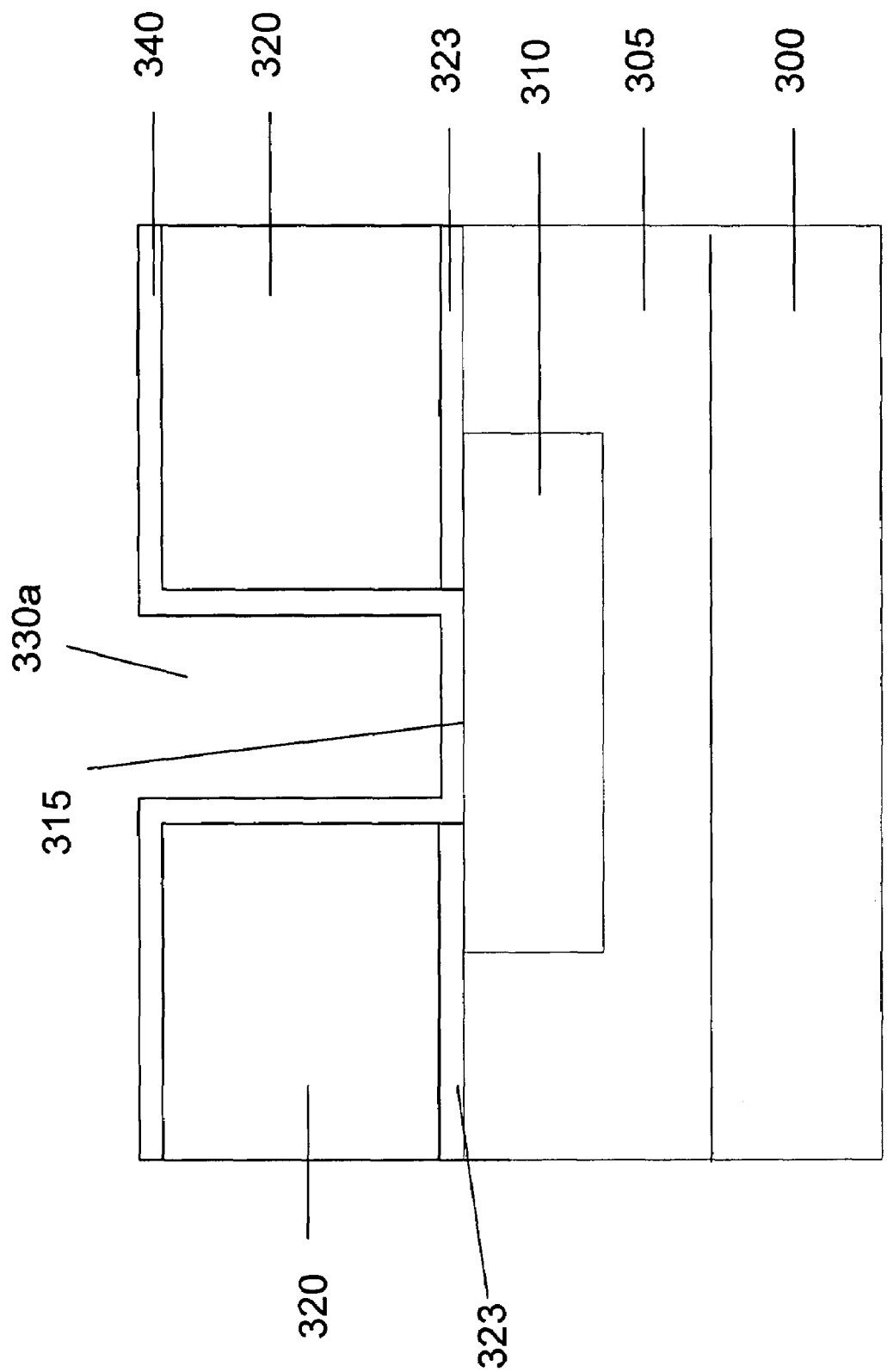

Referring to FIG. 3B, a substantially conformal conductive liner layer 340 is formed over the second dielectric layer 320, the via hole 330 and the exposed surface 315 of the conductive layer 310. As a result, a via hole 330a is formed within the dielectric layer 320. The conductive liner layer 340 and the fabrication method thereof are similar to those of the conductive liner layer 240 described above with reference to FIG. 2B. Detailed descriptions are not repeated. In this embodiment, the conductive liner layer 340 also covers the sidewalls of the etch stop layer 323. As described above with reference to FIG. 2B, the conductive liner layer 340 may fill the via hole 330. The filling of the via hole 330, however, may increase the resistance of a dual damascene structure. But if the via hole 330 is not so high as to create a high-resistance via, the filling of the via hole 330 may still be feasible for a dual damascene structure. One of ordinary skill in the art, after viewing the embodiment, will understand and can readily determine whether the conductive liner layer 340 should fill the via hole 330 in any given configuration.

Figure 3C:
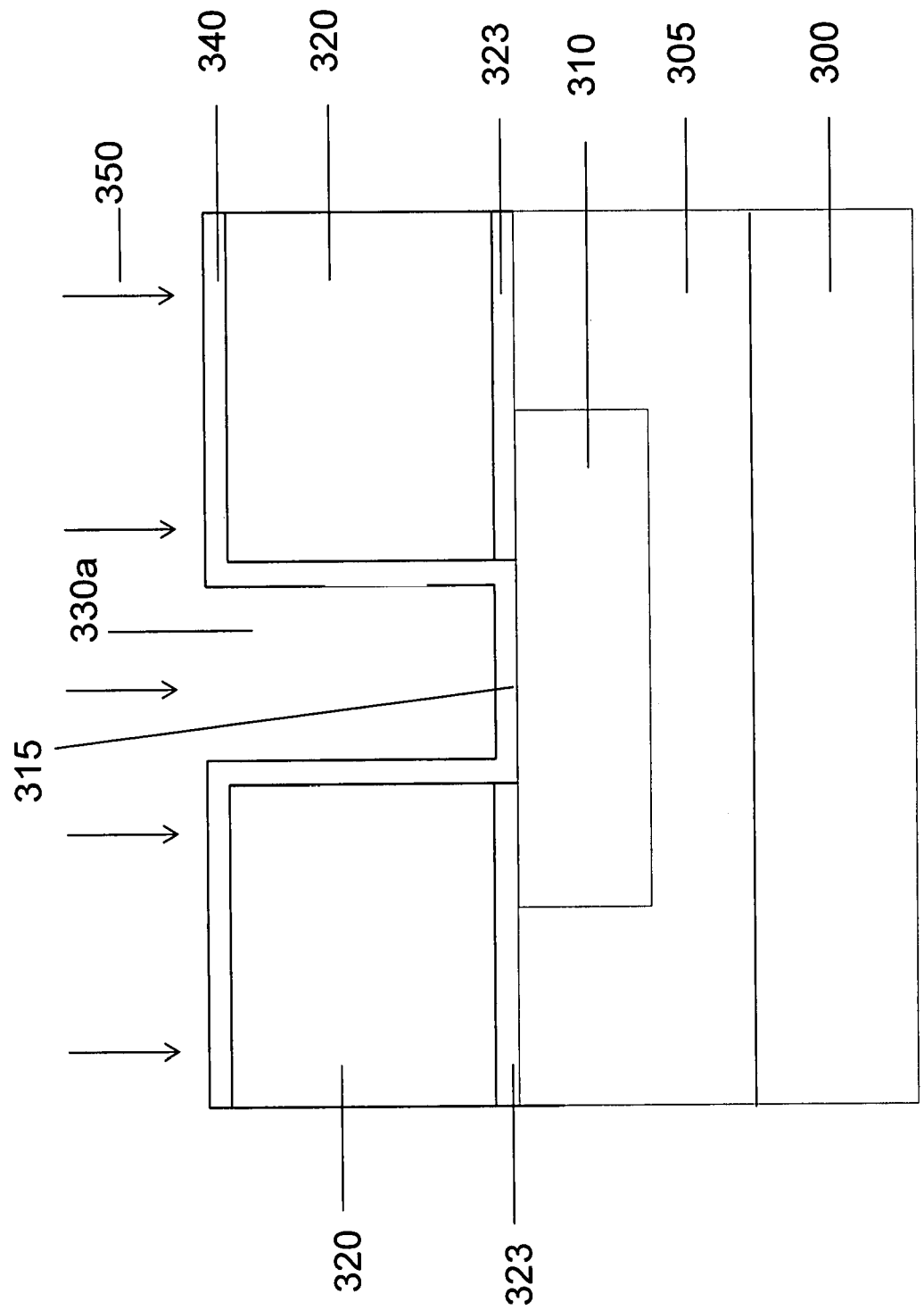

Referring to FIG. 3C, a plasma treatment 350 is performed on the surface of the conductive liner layer 340. The plasma treatment 350 removes one or a few oxide atomic layers formed on the surface of the conductive liner layer 340. The plasma treatment 350 may be the same as or similar to the plasma treatment 250 described above with reference to FIG. 2C. Detailed descriptions are not repeated.

Figure 3D:
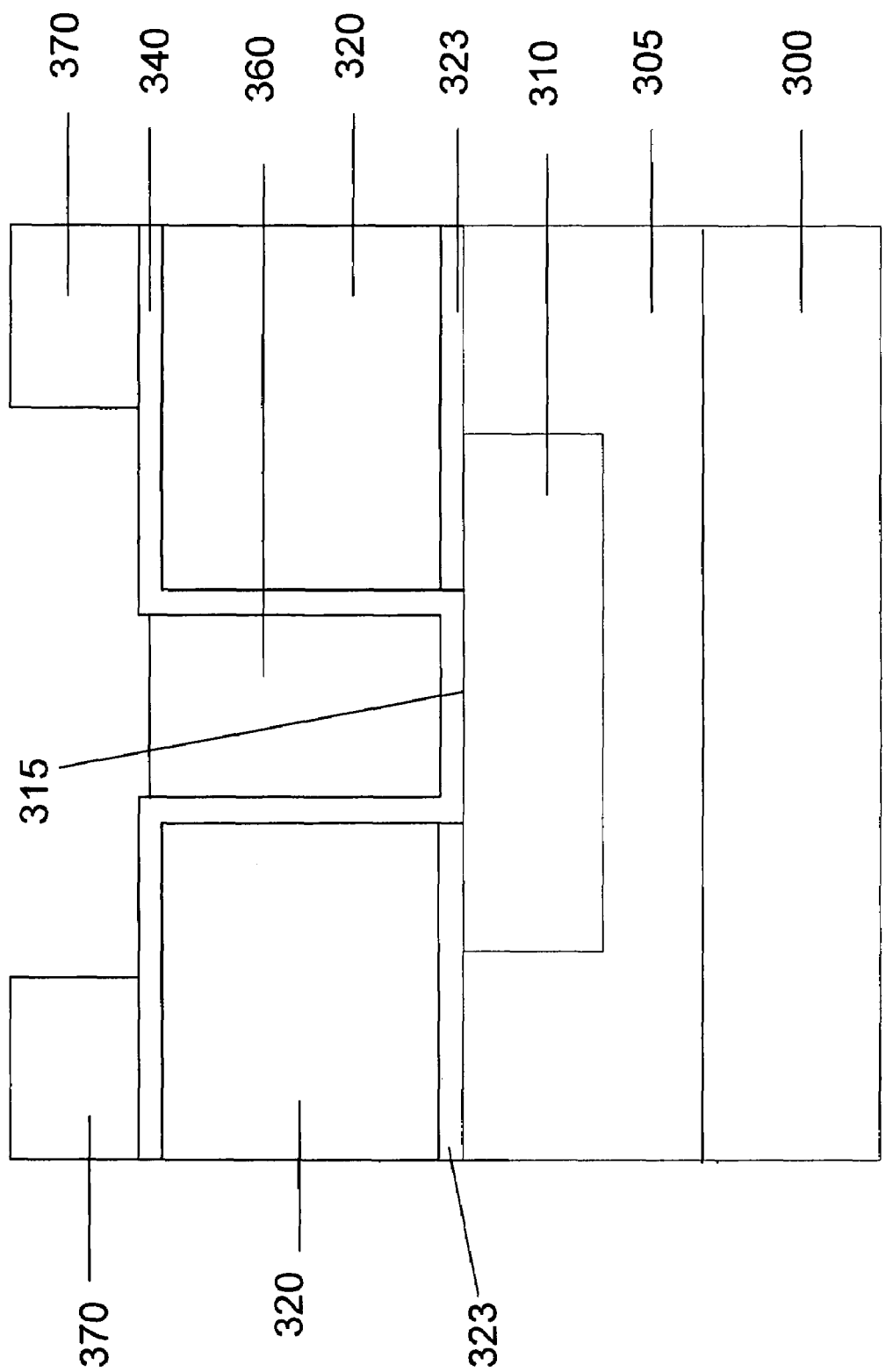

Referring to FIG. 3D, a planarization material 360 is formed in the via hole 330 and a patterned mask layer 370 is formed over the conductive liner layer 340. The planarization material 360 and the patterned mask layer 370 may be the same as or similar to the planarization material 260 and the patterned mask layer 270 described above with reference to FIG. 2D. Detailed descriptions of the planarization material 260 and the patterned mask layer 270 are not repeated.

The planarization material 360 can be formed by first forming a planarization layer (not shown) over the structure of FIG. 3C. The planarization layer over the surface of the conductive liner layer 340 is then removed. The planarization material 360 is thus formed in the via hole 330a described above with reference to FIG. 3C. The method of forming the patterned mask layer 370 first forms a photoresist layer (not shown) over the structure after the planarization layer over the surface of the conductive liner layer 340 is removed. A photolithographic process is performed to pattern the photoresist layer.

Figure 3E:
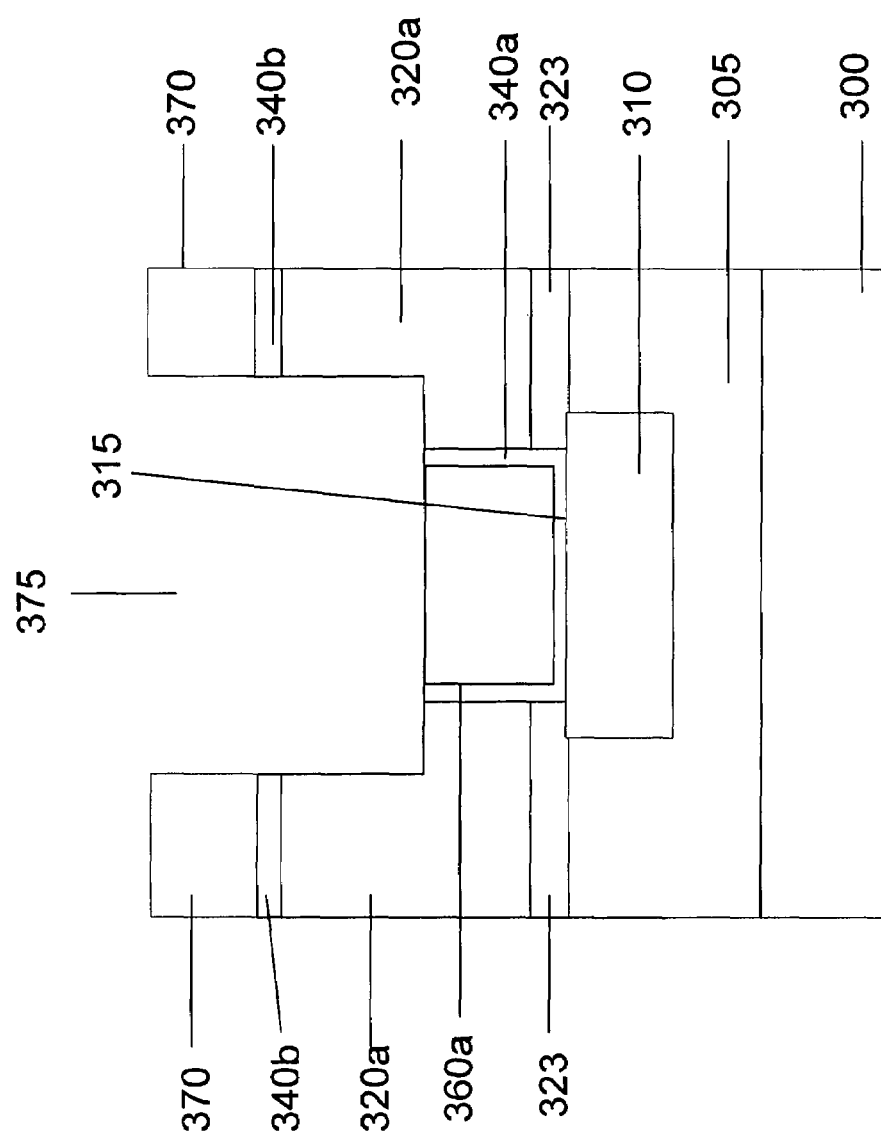

Referring to FIG. 3E, portions of the conductive liner layer 340, the second dielectric layer 320 and the planarization material 360 are removed so as to form a trench 375 in the first dielectric layer 320. By the removing process, the remaining conductive liners 340a and 340b are formed on the sidewalls of the via hole 330b shown in FIG. 3F and on the conductive layer 310, and on the second dielectric layer 320, respectively. The removing process may be the same as or similar to that described above with reference to FIG. 2E. Detailed descriptions are not repeated.

Figure 3F:
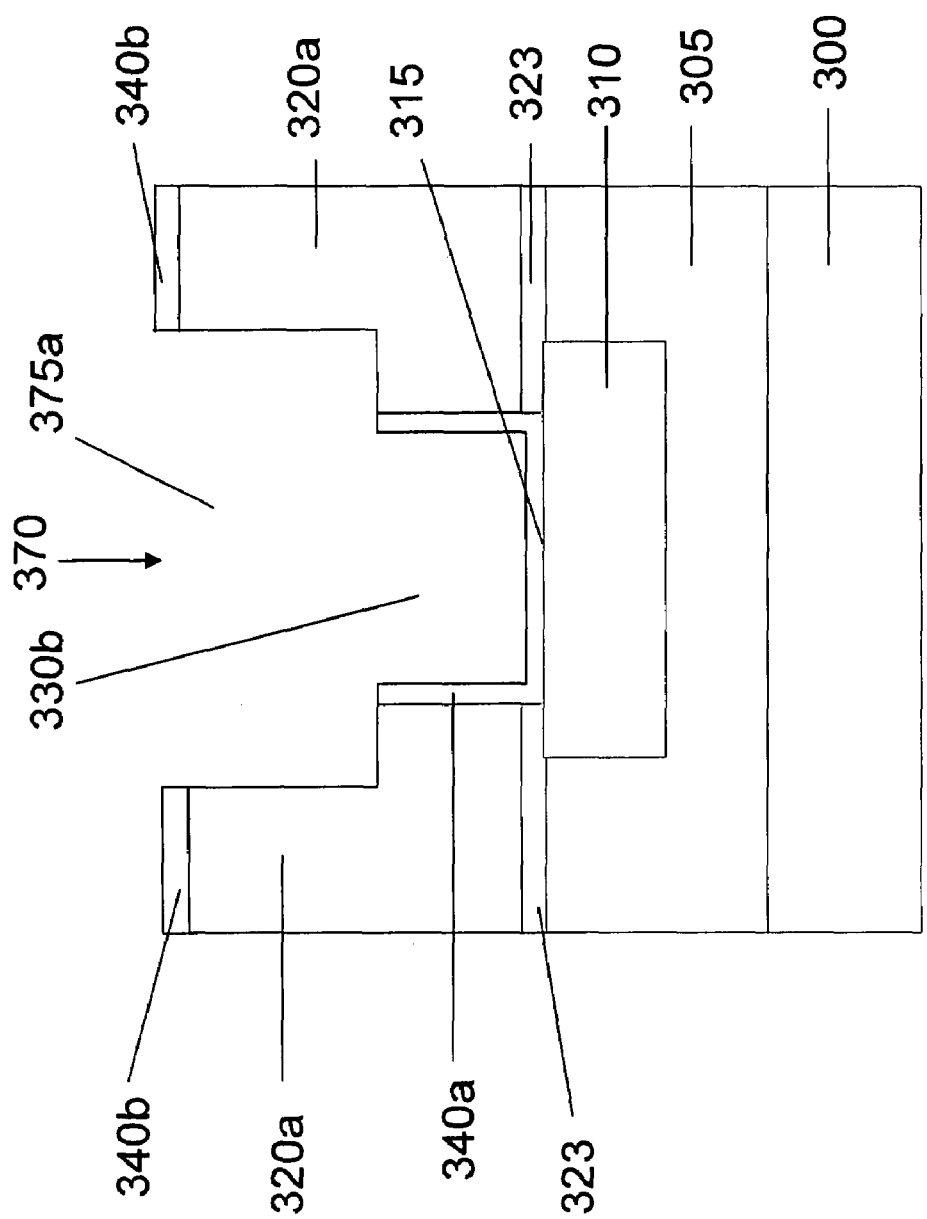

Referring to FIG. 3F, a mask layer removing process is applied to remove the patterned mask layer 370. The removing process may be the same as or similar to that described above with reference to FIG. 3F. Detailed descriptions are not repeated. According to the embodiment, the via hole and trench structure 378 are formed. The conductive liner layer 340a covers the exposed surface 315 of the conductive layer 210, as well as the sidewalls of the etch stop layer 323. The trench 375a is on the via hole 330b without forming the conductive liner 340a therein.

Figure 3G:
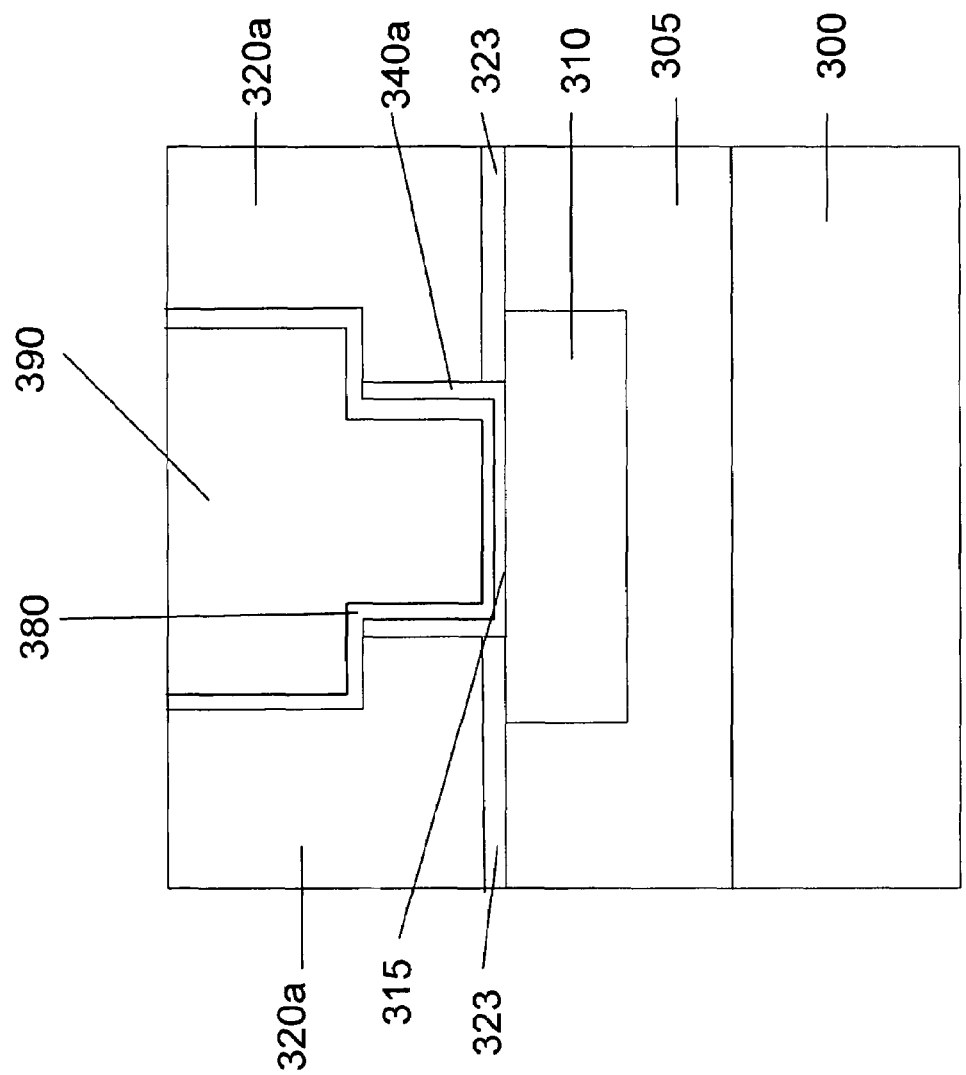
FIG. 3G is a schematic cross sectional drawing showing another exemplary dual damascene structure.

FIG. 3G is a schematic cross sectional drawing showing the completed exemplary dual damascene structure.

Referring to FIG. 3G, a barrier layer 380 is substantially conformal over the structure in FIG. 3F. A conductive layer 390 is then formed in the via hole and trench structure 378. The barrier layer 380 is formed before the formation of the conductive layer 390.

The liner layer 380 and the second conductive layer 390 are the same as or similar to the barrier layer 280 and the second conductive layer 290 described above with reference to FIG. 2G, respectively. Detailed descriptions are not repeated.

By the formation of the conductive liner covering the exposed surface of the conductive layer, oxidation occurring on the exposed surface of the conductive layer is thus avoided. From these exemplary methods and structures, damage resulting from the plasma treatment on the dielectric layer can also be suppressed.

Although the present invention has been described in terms of exemplary embodiment, it is not limit thereto. Rather, the appended claims should be constructed broadly to include other variants and embodiments of the invention which may be made by those skilled in the field of this art without departing from the scope and range of equivalents of the invention.

What is claimed is:

1. A structure, comprising:
   a first conductive layer in a dielectric layer;
   a via structure in the dielectric layer contacting a portion of a surface of the first conductive layer, wherein the via structure comprises a conductive liner therein, contacting the portion of the surface of the first conductive layer;
   a trench structure on the via structure in the dielectric layer without the conductive liner therein; and
   an etch stop layer between the dielectric layer and the conductive layer, the etch stop layer around the via structure.

2. The structure of claim 1, wherein the conductive liner is substantially conformal in the via structure, on sidewalls of the via structure.

3. The structure of claim 1, wherein the conductive liner comprises titanium nitride (TiN) or tantalum nitride (TaN).

4. The structure of claim 1, further comprising:
   a second conductive layer in the trench structure and the via structure, wherein the via structure and the trench structure constitute a dual damascene structure.

5. A semiconductor structure, comprising:
   a first conductive layer disposed over a substrate:
   a dielectric layer disposed over the first conductive layer; and
   an etch stop layer disposed between the first conductive layer and the dielectric layer;
   a dual damascene structure within the dielectric layer and contacting the first conductive layer,
   wherein the dual damascene structure comprises a trench structure disposed over a via structure, the dual damascene structure comprising a barrier layer disposed around a second conductive layer and the via structure extending through the etch stop layer and comprising a conductive liner disposed around the barrier layer and contacting the first conductive layer.

6. The semiconductor structure of claim 5, wherein the conductive liner is substantially conformal on sidewalls of the via structure.

7. The semiconductor structure of claim 5, wherein the conductive liner comprises titanium nitride (TiN) or tantalum nitride (TaN).

8. The semiconductor structure of claim 5, wherein the barrier layer extends along sidewalls of the trench structure and a step formed at a junction between the trench structure and via structure, and between the conductive layer and the second conductive layer in the via structure.

* * * * *

UNITED STATES PATENT AND TRADEMARK OFFICE
CERTIFICATE OF CORRECTION

| | |
|---|---|
| PATENT NO. | : 7,436,009 B2 |
| APPLICATION NO. | : 11/732883 |
| DATED | : October 14, 2008 |
| INVENTOR(S) | : Yi-Chen Huang et al. |

It is certified that error appears in the above-identified patent and that said Letters Patent is hereby corrected as shown below:

Column 5, line 22, replace "structLire" with --structure--

Column 8, line 16 in claim 5, delete the word "and"

Signed and Sealed this

Twenty-first Day of April, 2009

JOHN DOLL
*Acting Director of the United States Patent and Trademark Office*